(12) United States Patent
Qu et al.

(10) Patent No.: US 11,804,564 B2
(45) Date of Patent: Oct. 31, 2023

(54) SOLAR CELL, MANUFACTURING METHOD THEREOF, AND PHOTOVOLTAIC MODULE

(71) Applicant: Jinko Solar Co., Ltd., Jiaxing (CN)

(72) Inventors: Jiahua Qu, Jiaxing (CN); Jingsheng Jin, Jiaxing (CN); Linan Zhang, Jiaxing (CN)

(73) Assignee: Jinko Solar Co., Ltd., Jiangxi (CN)

( * ) Notice: Subject to any disclaimer, the term of this patent is extended or adjusted under 35 U.S.C. 154(b) by 0 days.

(21) Appl. No.: 17/737,908

(22) Filed: May 5, 2022

(65) Prior Publication Data
US 2023/0079799 A1 Mar. 16, 2023

(30) Foreign Application Priority Data
Sep. 16, 2021 (CN) .......................... 202111084159.2

(51) Int. Cl.
*H01L 31/049* (2014.01)
*H01L 31/0312* (2006.01)
(Continued)

(52) U.S. Cl.
CPC ........ *H01L 31/049* (2014.12); *H01L 31/0312* (2013.01); *H01L 31/1876* (2013.01); *H01L 31/062* (2013.01)

(58) Field of Classification Search
CPC . H01L 31/049; H01L 31/0312; H01L 31/062; H01L 31/747; H01L 31/0747
See application file for complete search history.

(56) References Cited

U.S. PATENT DOCUMENTS

2009/0286347 A1* 11/2009 Kim .................... H01L 31/0747
257/E31.124
2013/0233380 A1* 9/2013 Zhao .................... H01L 31/0749
438/94
(Continued)

FOREIGN PATENT DOCUMENTS

CN 105742391 A 7/2016
CN 107464855 A 12/2017
(Continued)

OTHER PUBLICATIONS

CN-212874518-U English Machine translation (Year: 2021).*
(Continued)

*Primary Examiner* — Andrew J Golden
(74) *Attorney, Agent, or Firm* — Knobbe, Martens, Olson & Bear, LLP

(57) ABSTRACT

Provided is a solar cell, including: an N-type semiconductor substrate having a front surface and a rear surface opposite to the front surface; a boron diffusion layer arranged on the front surface of the N-type semiconductor substrate, a first passivation layer is provided on a surface of the boron diffusion layer, and a first electrode is provided passing through the first passivation layer to form an electrical connection with the N-type semiconductor substrate; and a phosphorus-doped polysilicon layer arranged on the rear surface of the N-type semiconductor substrate. A silicon oxide layer containing nitrogen and phosphorus is provided between the rear surface of the N-type semiconductor substrate and the phosphorus-doped polysilicon layer, a second passivation layer is provided on a surface of the phosphorus-doped polysilicon layer, and a second electrode is provided passing through the second passivation layer to form an electrical connection with the phosphorus-doped polysilicon layer.

20 Claims, 4 Drawing Sheets

(51) Int. Cl.
    *H01L 31/18*    (2006.01)
    *H01L 31/062*   (2012.01)

(56) References Cited

U.S. PATENT DOCUMENTS

| | | | |
|---|---|---|---|
| 2014/0261666 A1 | 9/2014 | Stewart et al. | |
| 2014/0299187 A1* | 10/2014 | Chang | H01L 31/0747 |
| | | | 136/258 |
| 2014/0338749 A1 | 11/2014 | Aguiar | |

FOREIGN PATENT DOCUMENTS

| | | | |
|---|---|---|---|
| CN | 109285896 A | | 1/2019 |
| CN | 110164761 A | | 8/2019 |
| CN | 111933752 A | | 11/2020 |
| CN | 111987182 A | | 11/2020 |
| CN | 212848424 U | | 3/2021 |
| CN | 212874518 U | | 4/2021 |
| CN | 112951927 A | * | 6/2021 |
| JP | 2005183469 A | | 7/2005 |
| JP | 2010537423 A | | 12/2010 |
| JP | 2012-506629 A | | 3/2012 |
| JP | 2017028329 A | | 2/2017 |
| JP | 2017535975 A | | 11/2017 |
| JP | 2019091743 A | | 6/2019 |
| JP | 2019117963 A | | 7/2019 |
| JP | 2019176153 A | | 10/2019 |
| JP | 2020167243 A | | 10/2020 |
| JP | 2021061395 A | | 4/2021 |

OTHER PUBLICATIONS

CN-112951927-A English machine translation (Year: 2021).*
Office Action in Japanese Application No. JP 2020-073688 dated Aug. 26, 2022 in 12 pages.
Chen et al., "N-type polysilicon passivating contacts using ultra-thin PECVD Silicon oxynitrides as the interfacial layer," Solar Energy Materials and Solar Cells, Oct. 2021, vol. 232, No. 111356.
Stöhr et al., "Firing-Stable PECVD SiOxNy/n-Poly-Si Surface Passivatlon for Silicon Solar Cells," ACS Applied Energy Materials, Apr. 21, 2021, vol. 4, No. 5 No. 4646-4653.
Sheng et al., "Impact of phosphorus diffusion on n-type poly-Si based passivated contact Silicon solar cells," Solar Energy Materials and Solar Cells, Dec. 2019, vol. 203, No. 110120.
Yadav et al., "Comparative study of different Silicon oxides used as interfacial passivation layer (SiNy:H / SiOx /n+-Si) in industrial monocrystalline silicon solar cells," Solar Energy Materials and Solar Cells, Oct. 2019, vol. 201, No. 110077.
Extended Search Report in European Application No. EP 22171493.4 dated Aug. 26, 2022 in 14 pages.
Notice of Allowance for Chinese Application No. 202111084159.2, dated Feb. 14, 2022, in 4 pages.
Office Action for Chinese Application No. 202111084159.2, dated Jan. 28, 2022, in 5 pages.
Notice of Allowance issued in JP patent application No. 2022-073688, dated Jan. 31, 2023.

* cited by examiner

SOLAR CELL, MANUFACTURING METHOD THEREOF, AND PHOTOVOLTAIC MODULE

CROSS-REFERENCE TO RELATED APPLICATIONS

The present application claims priority to Chinese Patent Application No. 202111084159.2, filed on Sep. 16, 2021, the content of which is incorporated herein by reference in its entirety.

TECHNICAL FIELD

The present disclosure relates to the technical field of photovoltaic cells and, in particular, to a solar cell and a manufacturing method thereof, and a photovoltaic module.

BACKGROUND

Tunnel oxide passivation contact (Topcon) cells rely on a "tunneling effect" to achieve rear surface passivation. A rear surface structure of an existing Topcon cell includes a semiconductor substrate, a tunnel oxide layer, a phosphorus-doped polysilicon layer, and a rear surface passivation layer sequentially arranged from inside to outside. Since the tunnel oxide layer is made of silicon dioxide, silicon dioxide effectively performs passivation to dangling bonds and defects on a silicon surface, which significantly increases an open-circuit voltage of the solar cell, thereby improving conversion efficiency of the solar cell. However, the quality of a film cannot be effectively guaranteed due to the silicon dioxide layer is too thin, many defects and pores may exist in the film. As a result, a short circuit may occur in the solar cell, and a degree of recombination of carriers on a rear surface of the solar cell may be significantly reduced. If the problem of a leakage current is solved by increasing a thickness of a silicon dioxide film, an excessively thick silicon dioxide film may seriously block migration of electrons, and the tunneling effect may decrease accordingly, which increases series resistance of the solar cell, and a filling factor and a current of the solar cell may be adversely affected. Moreover, due to structural characteristics of silicon dioxide, entry of some ions with a small ionic radius, especially Na ions, may destroy the passivation effect during the use of the solar cell, which may lead to certain impact to the service life of the solar cell.

Therefore, there is a need to find a solar cell that can improve the back passivation effect of the solar cell and, at the same time, bring a strong tunneling effect.

SUMMARY

In view of the above, the present disclosure provides a solar cell and a manufacturing method thereof, and a photovoltaic module. The solar cell brings good back passivation effect as well as a strong tunneling effect.

In a first aspect, in some embodiments of the present disclosure, a solar cell is provided, the solar cell includes: an N-type semiconductor substrate having a front surface and a rear surface opposite to the front surface; a boron diffusion layer arranged on the front surface of the N-type semiconductor substrate, a first passivation layer is provided on a surface of the boron diffusion layer, and a first electrode is provided passing through the first passivation layer to form an electrical connection with the N-type semiconductor substrate; and a phosphorus-doped polysilicon layer arranged on the rear surface of the N-type semiconductor substrate. A silicon oxide layer containing nitrogen and phosphorus is provided between the rear surface of the N-type semiconductor substrate and the phosphorus-doped polysilicon layer, a second passivation layer is provided on a surface of the phosphorus-doped polysilicon layer, and a second electrode is provided passing through the second passivation layer to form an electrical connection with the phosphorus-doped polysilicon layer.

In one or more embodiments, the silicon oxide layer containing nitrogen and phosphorus has a single oxide layer structure.

In one or more embodiments, the silicon oxide layer has a structure of multiple oxide layers, the structure of multiple oxide layers includes a first oxide sub-layer, a second oxide sub-layer, and a third oxide sub-layer.

In one or more embodiments, at least one of the first oxide sub-layer, the second oxide sub-layer, and the third oxide sub-layer contains Al and/or Ta.

In one or more embodiments, the first oxide sub-layer is a nitrogen-doped silicon oxide layer, the nitrogen-doped silicon oxide layer includes $SiO_xN_y$, where $y/(x+y)<15\%$, and/or a doping concentration of nitrogen in the nitrogen-doped silicon oxide layer decreases from the N-type semiconductor substrate to the phosphorus-doped polysilicon layer.

In one or more embodiments, the first oxide sub-layer has a thickness in a range from 1 Å to 2 Å.

In one or more embodiments, the third oxide sub-layer is a phosphorus-doped silicon oxide layer, and a doping concentration of phosphorus in the phosphorus-doped silicon oxide layer is in a range from $1\times10^{10}$ cm$^{-3}$ to $1\times10^{18}$ cm$^{-3}$, and/or a doping concentration of phosphorus in the phosphorus-doped silicon oxide layer increases from the N-type semiconductor substrate to the phosphorus-doped polysilicon layer.

In one or more embodiments, the third oxide sub-layer has a thickness in a range from 2 Å to 3 Å.

In one or more embodiments, the second oxide sub-layer is made of silicon dioxide, and/or the second oxide sub-layer has a thickness in a range from 8 Å to 10 Å, and/or the second oxide sub-layer has a pinhole density in a range from $10^{-6}$ to $10^{-3}$.

In one or more embodiments, a sum of thicknesses of the first oxide sub-layer, the second oxide sub-layer, and the third oxide sub-layer is less than or equal to 16 Å.

In one or more embodiments, the phosphorus-doped polysilicon layer has a doping concentration in a range from $1\times10^{19}$ cm$^{-3}$ to $1\times10^{21}$ cm$^{-3}$.

In one or more embodiments, the first passivation layer includes at least one of silicon nitride, silicon oxynitride, and aluminum oxide.

In one or more embodiments, the second passivation layer includes at least one of silicon nitride, silicon oxynitride, and aluminum oxide.

In one or more embodiments, the first electrode is a silver electrode or a silver/aluminum electrode, and/or the second electrode is a silver electrode.

In a second aspect, in some embodiments of the present disclosure, a method for manufacturing a solar cell is provided, including: performing boron diffusion on a front surface of an N-type semiconductor substrate after the N-type semiconductor substrate is textured, to form a boron diffusion layer; forming an oxide layer containing nitrogen and phosphorus on a rear surface of the N-type semiconductor substrate; depositing a polysilicon layer on a surface of the oxide layer containing nitrogen and phosphorus, and performing secondary phosphorus diffusion on the polysilicon layer, to form a phosphorus-doped polysilicon layer; forming a second passivation layer on a surface of the phosphorus-doped polysilicon layer; forming a first passivation layer on a surface of the boron diffusion layer, and forming a first electrode by passing through the first passivation layer to be electrically connected to the boron diffusion layer; and forming a second electrode by passing through the second passivation layer to be electrically connected to the phosphorus-doped polysilicon layer.

In one or more embodiments, the forming an oxide layer containing nitrogen and phosphorus includes: during oxidization, performing primary phosphorus diffusion on the oxidized product to form a third oxide sub-layer; continuing the oxidization to form a second oxide sub-layer after the third oxide sub-layer is formed, the second oxide sub-layer is provided between the third oxide sub-layer and the N-type semiconductor substrate; continuing the oxidization after the second oxide sub-layer is formed, and during the oxidization, performing nitrogen diffusion on the oxidized product to form a first oxide sub-layer, the first oxide sub-layer is provided between the second oxide sub-layer and the N-type semiconductor substrate.

In one or more embodiments, the performing primary phosphorus diffusion on the oxidized product to form a third oxide sub-layer includes: using a phosphorus source as a doping source, introducing $O_2$ at a flow rate in a range from 10 L/min to 12 L/min for 3 min to 5 min, and performing primary phosphorus diffusion on the oxidized product after the introduction stops, wherein a temperature of the primary phosphorus diffusion is in a range from 780° C. to 820° C., and a time of the primary phosphorus diffusion is in a range from 50 s to 60 s.

In one or more embodiments, the continuing the oxidization to form a second oxide sub-layer after the third oxide sub-layer is formed includes: after $O_2$ is introduced at a flow rate in a range from 8 L/min to 10 L/min for 3 min to 5 min, stopping the introduction and performing oxidization, wherein a temperature of the oxidization is in a range from 500° C. to 530° C., and a time of the oxidization is in a range from 350 s to 450 s.

In one or more embodiments, the continuing the oxidization after the second oxide sub-layer is formed, and during the oxidization, performing nitrogen diffusion on the oxidized product to form a first oxide sub-layer includes: using a mixture of $O_2$ and $N_2O$ with a volume ratio of (2-4):1 as a doping source, introducing the mixture at a flow rate in a range from 8 L/min to 10 L/min for 3 min to 5 min, and performing nitrogen diffusion on the oxidized product after the introduction stops, wherein a temperature of the nitrogen diffusion is in a range from 500° C. to 530° C., and a time of the nitrogen diffusion is in a range from 40 s to 60 s.

In a third aspect, in some embodiments of the present disclosure, a photovoltaic module is provided. The photovoltaic module includes a plurality of solar cell strings, each of the plurality of solar cell strings includes a plurality of solar cells, and at least one of the plurality of solar cells includes the solar cell described in the first aspect or a solar cell manufactured with the manufacturing method described in the second aspect.

BRIEF DESCRIPTION OF DRAWINGS

In order to better illustrate the technical solutions in embodiments of the present disclosure or the related art, the accompanying drawings used in the description of the embodiments or the related art will be introduced below. It is apparent that, the accompanying drawings in the following description are only some embodiments of the present disclosure, and other drawings can be obtained by those of ordinary skill in the art from the provided drawings without creative efforts.

DESCRIPTION OF EMBODIMENTS

Figure 1:
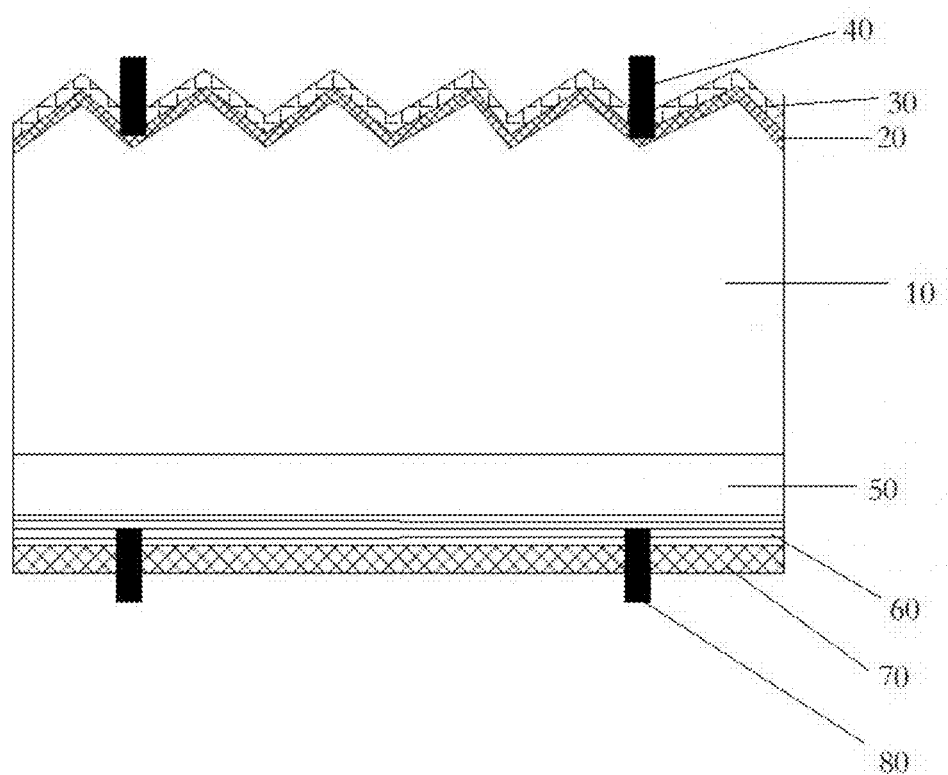
FIG. 1 is a first schematic structural diagram of a solar cell according to one or more embodiments of the present disclosure.

In order to better understand the technical solutions of the present disclosure, embodiments of the present disclosure are described in detail below with reference to the accompanying drawings.

It is to be understood that the described embodiments are merely some of rather than all of the embodiments of the present disclosure. All other embodiments acquired by those of ordinary skill in the art without creative efforts based on the embodiments in the present disclosure fall within the protection scope of the present disclosure.

The terms used herein in the embodiments of the present disclosure are for the purpose of describing specific embodiments only, and are not intended to limit the present disclosure. The singular forms of "a/an", "one", and "the" used in the embodiments of the present disclosure and the appended claims may also include plural forms, unless otherwise clearly indicated in the context.

It is to be understood that the term "and/or" used herein describes an association relationship between associated objects and represents that three relationships may exist. For example, A and/or B may represent the following three cases: only A exists, both A and B exist, and only B exists. In addition, the character "/" generally indicates an "or" relationship between the associated objects.

Topcon cells rely on a "tunneling effect" to achieve rear surface passivation of the cells. A rear surface structure of an existing Topcon solar cell includes an N-type semiconductor substrate, a tunnel oxide layer, a phosphorus-doped polysilicon layer, and a rear surface passivation layer sequentially arranged from inside to outside. The presence of the tunnel oxide layer and the doped polysilicon layer together form a passivation contact structure, which can effectively reduce surface recombination and metal contact recombination, and form an ohmic contact with metal electrodes. Conversion efficiency has great room for improvement. However, a silicon dioxide layer is generally relatively thin, and many defects and pores may exist in the film, resulting in a short circuit in the finally manufactured solar cell. If the problem of short circuit is solved by increasing a thickness of a silicon dioxide film, an excessively thick silicon dioxide film may seriously block migration of electrons, and the tunneling effect may decrease accordingly, which increases series resistance of the solar cell, and the filling factor and the current of the solar cell may be adversely affected.

Thus, in order to overcome the imperfections of the related art, the present disclosure provides a solar cell and a manufacturing method thereof. An oxide layer containing nitrogen and phosphorus is provided between the N-type semiconductor substrate and the phosphorus-doped polysilicon layer on a rear surface of the solar cell, which improves tunneling capability of the rear surface of the solar cell as well as the passivation effect of the rear surface of the solar cell, thereby improving conversion efficiency of the solar cell.

In a first aspect, FIG. 1 shows a solar cell according to some embodiments of the present disclosure. As shown in FIG. 1, the solar cell includes an N-type semiconductor substrate 10. The N-type semiconductor substrate 10 has a front surface and a rear surface.

A first passivation layer 30 is arranged on the front surface of the N-type semiconductor substrate 10. A first electrode 40 passes through the first passivation layer 30 to form an electrical connection with the N-type semiconductor substrate 10.

A phosphorus-doped polysilicon layer 60 is arranged on the rear surface of the N-type semiconductor substrate 10. An oxide layer 50 containing nitrogen and phosphorus is arranged between the rear surface of the N-type semiconductor substrate 10 and the phosphorus-doped polysilicon layer 60. A second passivation layer 70 is arranged on a surface of the phosphorus-doped polysilicon layer 60. A second electrode 80 passes through the second passivation layer 70 to form an electrical connection with the phosphorus-doped polysilicon layer 60.

In the above embodiment, the oxide layer 50 containing nitrogen and phosphorus is arranged between the rear surface of the N-type semiconductor substrate 10 and the phosphorus-doped polysilicon layer 60. The doping of element N may increase an interfacial dielectric constant of the oxide layer, thus improve a passivation effect and increase an open-circuit voltage. However, the doping of element N may increase internal resistance of the solar cell and decrease the filling factor. In this case, with the doping of P, donor impurity levels are generated near a conductive strip in a silicon dioxide bandgap, which can improve the tunneling current of electrons, reduce the internal resistance of the solar cell, and increase the filling factor. According to the present disclosure, the oxide layer containing nitrogen and phosphorus obtained by doping the above two elements can simultaneously increase the open-circuit voltage and the filling factor, thereby improving the conversion efficiency of the solar cell.

In some embodiments, the oxide layer 50 containing nitrogen and phosphorus is of a single oxide layer structure containing nitrogen and phosphorus.

Figure 2:
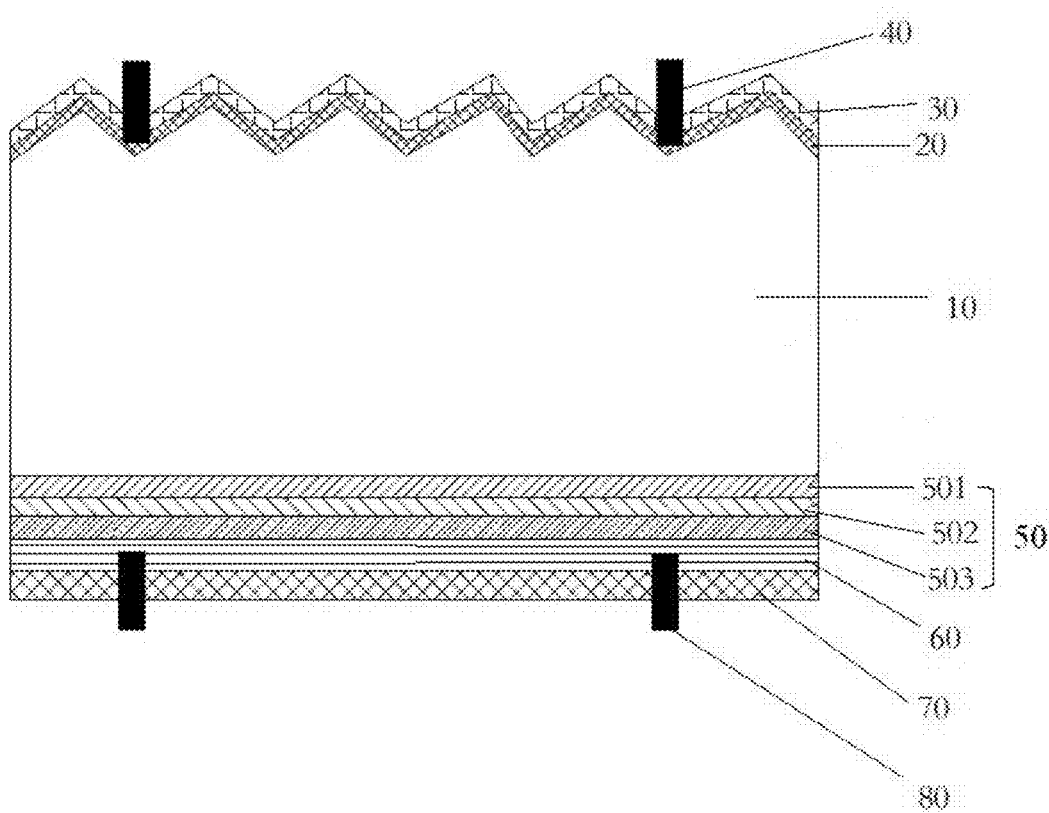
FIG. 2 is a second schematic structural diagram of a solar cell according to one or more embodiments of the present disclosure.

In some embodiments, the oxide layer 50 containing nitrogen and phosphorus is of a multi-layer structure. As shown in FIG. 2, the oxide layer includes a first oxide sub-layer 501, a second oxide sub-layer 502, and a third oxide sub-layer 503 sequentially from the N-type semiconductor substrate to the phosphorus-doped polysilicon layer 60. The first oxide sub-layer 501 is a nitrogen-doped silicon oxide layer, the second oxide sub-layer 502 is made of silicon dioxide, and the third oxide sub-layer 503 is a phosphorus-doped silicon oxide layer. In the present disclosure, the oxide layer 50 containing nitrogen and phosphorus may be designed as a multi-layer structure, which can increase both the passivation effect and the tunneling capability of the rear surface of the solar cell, thereby improving the conversion efficiency of the solar cell.

In some embodiments, in an actual manufactured product, since the oxide layer 50 containing nitrogen and phosphorus is very thin, the first oxide sub-layer 501, the second oxide sub-layer 502, and the third oxide sub-layer 503 are combined to form an integral structure. The oxide layer 50 containing nitrogen and phosphorus is shown, so the oxide layer contains nitrogen and phosphorus.

In some embodiments, the nitrogen-doped silicon oxide layer is made of $SiO_xN_y$, where $y/(x+y)<15\%$. An interface changes from a Si—$SiO_x$ bond to a Si—$SiN_x$ bond with the increasing content of N. Mismatch ratios of both a lattice constant and a thermal expansion coefficient of $SiN_x$ to Si are large, which may lead to the formation of a large number of defects and become traps and recombination centers of carriers, thus adversely affecting the migration rate of the carriers. Moreover, internal stress of a $SiN_x$ film is very large, and the film may break, resulting in complete failure of the passivation layer. Therefore, the content of N cannot be excessively large, and a doping proportion of N in the nitrogen-doped silicon oxide layer in the present disclosure should be controlled within 15%. A doping concentration of nitrogen in the nitrogen-doped silicon oxide layer decreases gradually from the N-type semiconductor substrate 10 to the phosphorus-doped polysilicon layer 60. A gradient of the above doping concentration is determined by a doping process.

In some embodiments, the first oxide sub-layer 501 has a thickness ranging from 1 Å to 2 Å. For example, the thickness of the first oxide sub-layer 501 may be 1 Å, 1.1 Å, 1.2 Å, 1.3 Å, 1.4 Å, 1.5 Å, 1.6 Å, 1.7 Å, 1.8 Å, 1.9 Å, or 2 Å. The first oxide sub-layer 501 in the present disclosure is very thin, which can increase an interfacial dielectric constant of the oxide layer, and improve the passivation effect without affecting migration of the carriers.

In some embodiments, the second oxide sub-layer 502 is made of silicon dioxide, and silicon dioxide acts as an insulating layer. The silicon dioxide layer is conducive to the tunneling of majority electrons into the polysilicon layer and the blocking of recombination of minority-carrier holes, and then the electrons are transported horizontally through the polysilicon layer and collected by metal, thereby greatly reducing a metal contact recombination current and increasing an open-circuit voltage and a short-circuit current of the solar cell.

In some embodiments, the second oxide sub-layer 502 has a thickness ranging from 8 Å to 10 Å. The thickness may be, for example, 8 Å, 9 Å or 10 Å. The thickness of the second oxide sub-layer 502 is controlled within the above range, which is conducive to the transport of majority carriers and significantly reduces interface recombination. When the thickness of the second oxide sub-layer is less than 8 Å, it passivation may not be achieved. When the thickness of the second oxide sub-layer is greater than 10 Å, the carriers cannot pass through effectively.

In some embodiments, the second oxide sub-layer 502 has a pinhole density ranging from $10^{-6}$ to $10^{-3}$. The pinhole density may be, for example, $10^{-6}$, $10^{-5}$, $10^4$ or $10^{-3}$. The carriers may be transported through pinholes. As a shunt path for carrier transport, the pinholes can reduce series resistance and increase the filling factor when carriers are transported through the pinholes, thereby improving the conversion efficiency of the solar cell. If the number of the pinholes is greater than $10^{-3}$, a junction barrier height may be decreased, and an open-circuit voltage may be reduced, thereby leading to reduction of passivation performance, increasing surface recombination, and reduction performance of the solar cell.

In some embodiments, the third oxide sub-layer 503 is a phosphorus-doped silicon oxide layer. In the present disclosure, element P is doped on silicon oxide, and a donor level is formed at a position near a conductive strip of silicon oxide. The existence of the impurity level and the surface heavily-doped polysilicon layer can improve the tunneling capability of electrons, reduce the obstruction to electron migration, and increase the filling factor. At the same time, phosphorosilicate glass (PSG) formed on the surface by P doping has a strong blocking effect on some metal ions, especially $Na^+$, which reduces the influence of the metal ions on the solar cell during use.

In some embodiments, a doping concentration of phosphorus in the phosphorus-doped silicon oxide layer ranges from $1\times10^{10}$ cm$^{-3}$ to $1\times10^{18}$ cm$^{-3}$. The doping concentration may be, for example, $1\times10^{10}$ cm$^3$ $1\times10^{11}$ cm$^3$, $1\times10^{12}$ cm$^{-3}$, $1\times10^{13}$ cm$^{-3}$, $1\times10^{14}$ cm$^{-3}$, $1\times10^{15}$, cm$^3$, $1\times10^{16}$ cm$^{-3}$, $1\times10^{17}$ cm$^{-3}$ or $1\times10^{18}$ cm$^{-3}$. If the doping concentration of phosphorus in the phosphorus-doped silicon oxide layer is higher than $1\times10^{18}$ cm$^{-3}$, excessive element P may cause impurity defects, which become traps and recombination centers of carriers. At the same time, during the use of the solar cell, excessive element P may reduce light transmittance of the passivation layer and affect the efficiency of the solar cell. If the doping concentration of phosphorus in the phosphorus-doped silicon oxide layer is lower than $1\times10^{10}$ cm$^{-3}$, it is insufficient to improve the tunneling capability of electrons as required.

In some embodiments, the doping concentration of phosphorus in the phosphorus-doped silicon oxide layer increases gradually from the N-type semiconductor substrate 10 to the phosphorus-doped polysilicon layer.

In some embodiments, the third oxide sub-layer 503 has a thickness ranging from 2 Å to 3 Å. The thickness of the third oxide sub-layer 503 may be, for example, 2 Å, 2.1 Å, 22 Å, 2.3 Å, 2.4 Å, 2.5 Å, 2.6 Å, 2.7 Å, 2.8 Å, 2.9 Å or 3 Å.

A sum of thicknesses of the first oxide sub-layer 501, the second oxide sub-layer 502, and the third oxide sub-layer 503 is less than or equal to 16 Å. The thickness may be, for example, 12 Å, 13 Å, 14 Å, 15 Å or 16 Å. An excessively thick oxide layer may seriously block the migration of electrons. Therefore, an overall thickness of the oxide layer is controlled within 16 Å in the present disclosure.

The first oxide sub-layer, the second oxide sub-layer, and the third oxide sub-layer may also be doped with at least one of Al (aluminum) and Ta (tantalum) that can provide holes, thereby improving the passivation effect.

Figure 3:
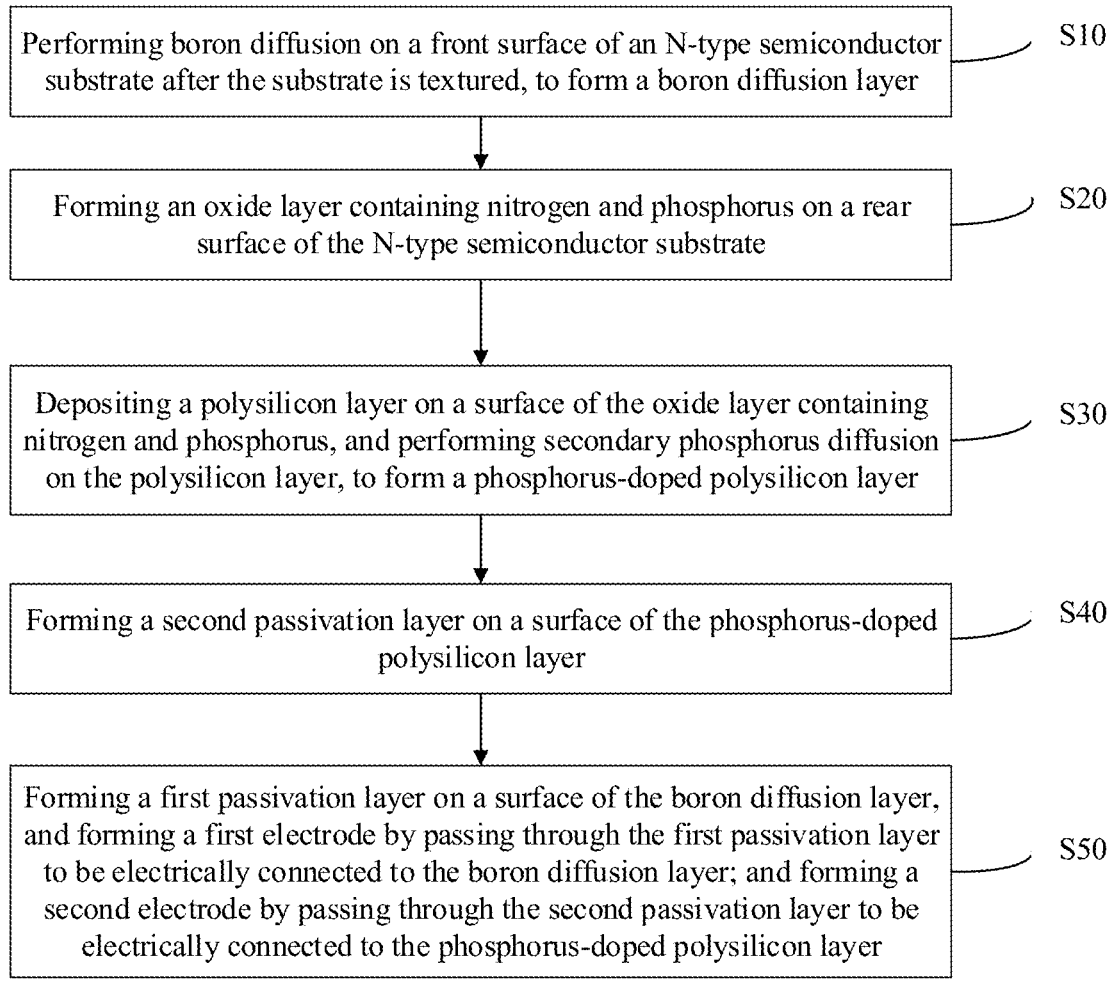
FIG. 3 is a first flowchart of a manufacturing process of a solar cell according to one or more embodiments of the present disclosure.

In a second aspect, according to some embodiments of the present disclosure, a method for manufacturing a solar cell is provided. FIG. 3 is a first flowchart of a method for manufacturing a solar cell according to some embodiments of the present disclosure, which includes the following steps.

In step S10, boron diffusion is performed on a front surface of an N-type semiconductor substrate 10 after texturing, to form a boron diffusion layer 20.

In step S20, a rear surface of the N-type semiconductor substrate 10 is oxidized to form an oxide layer 50 containing nitrogen and phosphorus.

In step S30, a polysilicon layer is deposited on a surface of the oxide layer 50 containing nitrogen and phosphorus, and secondary phosphorus diffusion is performed on the polysilicon layer to form a phosphorus-doped polysilicon layer 60.

In step S40, a second passivation layer 70 is formed on a surface of the phosphorus-doped polysilicon layer 60.

In step S50, a first passivation layer 30 is formed on a surface of the boron diffusion layer 20, a first electrode 40 is formed on the first passivation layer 30, and a second electrode is formed on the second passivation layer 70.

In the above embodiment, the oxide layer 50 containing nitrogen and phosphorus is provided between the rear surface of the N-type semiconductor substrate 10 and the phosphorus-doped polysilicon layer 60. The doping of element N can increase an interfacial dielectric constant of the oxide layer, so as to improve the passivation effect, and increase an open-circuit voltage. However, the doping of element N may increase internal resistance of the solar cell and decrease the filling factor. In this case, with the doping of element P, donor impurity levels are generated near a conductive strip in a silicon dioxide bandgap, which can improve the tunneling current of electrons, reduce the internal resistance of the solar cell, and increase the filling factor. According to the present disclosure, the oxide layer containing nitrogen and phosphorus obtained by doping the above two elements can simultaneously increase the open-circuit voltage and the filling factor, thereby improving the conversion efficiency of the solar cell.

In the present disclosure, the method for manufacturing a solar cell may be used to manufacture an N-type solar cell, and further used to manufacture an N-type Topcon cell. The method for manufacturing a Topcon cell according to the present disclosure will be clearly and completely described below with reference to the accompanying drawings of the present disclosure. The embodiments described are only some rather than all of the embodiments of the present disclosure.

Figure 4:
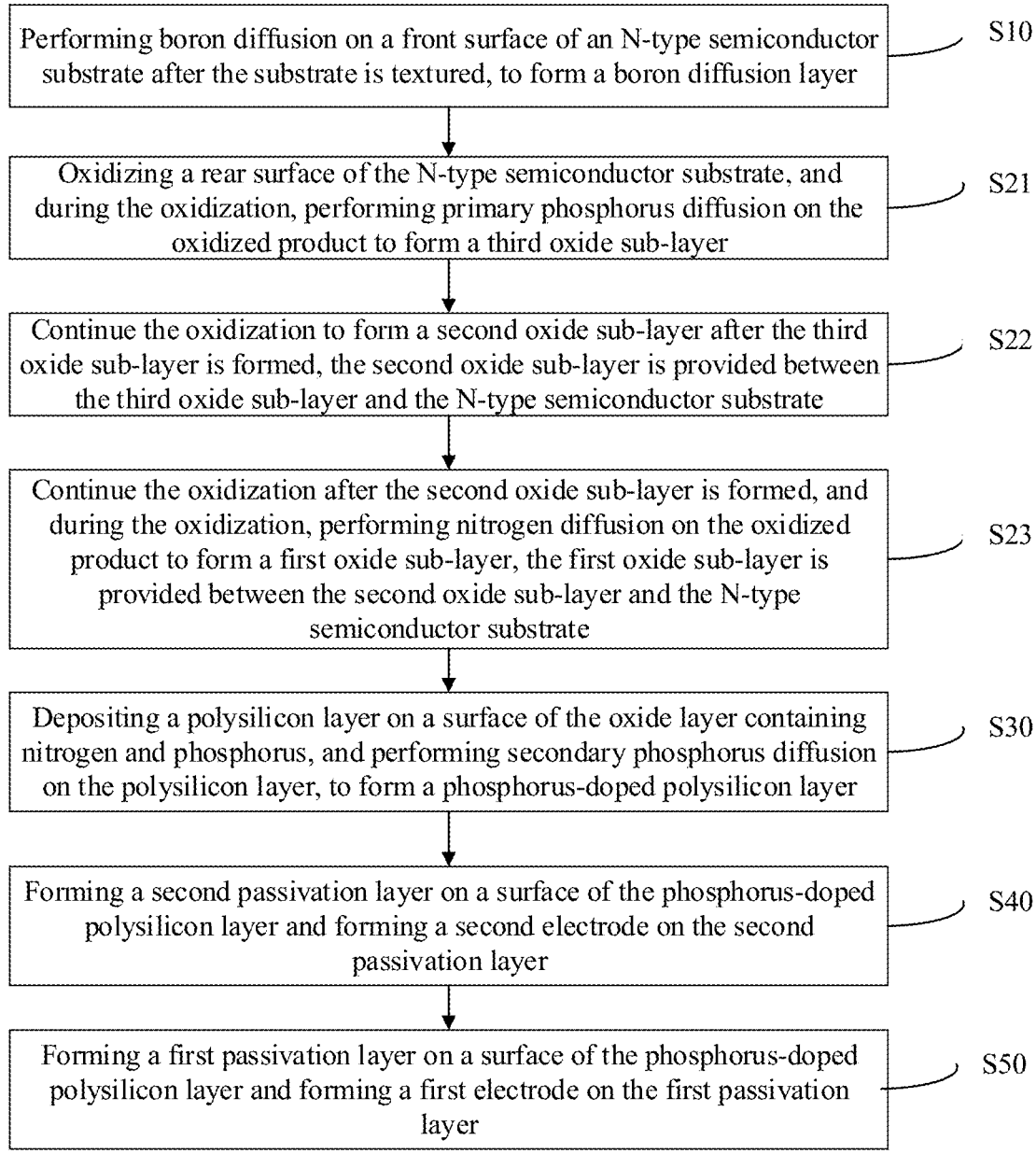
FIG. 4 is a second flowchart of a manufacturing process of a solar cell according to some embodiments of the present disclosure.

FIG. 4 is a second flowchart of a method for manufacturing a solar cell according to some embodiments. As shown in FIG. 4, some embodiments of the present disclosure provides a method for manufacturing a solar cell, which includes the following steps.

In step S10, boron diffusion is performed on a front surface of an N-type semiconductor substrate 10 after texturing, to form a boron diffusion layer 20.

Prior to boron diffusion, a front surface and a rear surface of the N-type semiconductor substrate 10 may be textured, to form a textured or surface texture structure (e.g. a pyramid structure). The texturing may be performed by chemical etching, laser etching, mechanical etching, plasma etching, etc., which is not limited herein. For example, the front surface and the rear surface of the N-type semiconductor substrate may be textured using a NaOH solution. Due to the anisotropy of corrosion of the NaOH solution, a pyramid textured structure may be manufactured.

The surface of the N-type semiconductor substrate 10 is textured to have a textured structure, which produces a light trapping effect and increases an amount of light absorbed by the solar cell, so as to improve the conversion efficiency of the solar cell.

In some embodiments, the front surface of the N-type semiconductor substrate 10 is a surface facing the sun, and the rear surface is a surface facing away from the sun. It is to be further noted that, the semiconductor substrate may be a crystalline silicon substrate (silicon substrate), for example, a polycrystalline silicon substrate, a monocrystalline silicon substrate or a monocrystalline silicon-like substrate. The specific type of the semiconductor substrate is not limited in the embodiments of the present disclosure.

In step S10, the boron diffusion layer 20 may be formed on the front surface of the N-type semiconductor substrate 10 by any one or more of high-temperature diffusion, slurry doping and ion implantation.

In some embodiments, the boron diffusion layer 20 is formed by diffusing boron atoms through a boron source. For example, boron tribromide may be used as the boron source for diffusion, so that a microcrystalline silicon phase of crystalline silicon is transformed into a polycrystalline silicon phase. Due to a high concentration of boron on the surface of the N-type semiconductor substrate 10, a layer of borosilicate glass (BSG) is generally formed. This layer of BSG has a metal impurity absorption effect, which may adversely affect normal operation of the solar cell and thus is required to be removed later.

In some embodiments, prior to the texturing, a step of cleaning the N-type semiconductor substrate 10 may also be included to remove metal and organic contaminants from the surface.

In step S20, a rear surface of the N-type semiconductor substrate 10 is oxidized to form an oxide layer 50 containing nitrogen and phosphorus.

In some embodiments, the oxide layer 50 containing nitrogen and phosphorus has a thickness less than or equal to 16 Å. The thickness may be, for example, 12 Å, 13 Å, 14 Å, 15 Å or 16 Å. An excessively thick oxide layer 50 containing nitrogen and phosphorus may seriously hinder the migration of electrons. Therefore, the thickness of the oxide layer is controlled within 16 Å in the present disclosure.

It is to be noted that, the specific operation manner of forming the oxide layer is not limited in the embodiments of the present disclosure. In some embodiments, the rear surface of the N-type semiconductor substrate 10 may be etched by ozone oxidation, high-temperature thermal oxidation or nitric acid oxidation, and then oxidized. For example, the rear surface of the N-type semiconductor substrate 10 is oxidized by thermal oxidation.

Compared with an existing thin oxide layer or tunnel oxide layer, in the present disclosure, silicon oxide's capability of increasing electron tunneling is maintained without increasing the thickness.

In step S21, the rear surface of the N-type semiconductor substrate 10 is oxidized, and during the oxidization, primary phosphorus diffusion is performed on the oxidized product to form a third oxide sub-layer 503.

A specific step may include: using a phosphorus source as a doping source, introducing $O_2$ at a flow rate ranging from 10 L/min to 12 L/min for 3 min to 5 min, and performing primary phosphorus diffusion on the oxidized product after the gas introduction stops, the temperature of the primary phosphorus diffusion ranging from 780° C. to 820° C., and the time of the primary phosphorus diffusion ranging from 50 s to 60 s.

In the above step, in-situ doping is used for oxidation and phosphorus diffusion at the same time, the oxidation may adopt any one of: ozone oxidation, high temperature thermal oxidation, nitric acid oxidation. Phosphorus diffusion refers to the formation of doping layer by diffusion of pentavalent phosphorus atoms under high temperature conditions (generally >600° C.)

In some embodiments, during the phosphorus diffusion, a phosphorus source may be $POCl_3$ or $PH_3$, in which $POCl_3$ is preferred in some embodiment. $POCl_3$ is liquid and volatile. In the doping process, the phosphorus source may be brought in through the introduction of oxygen, and oxidation and doping are performed simultaneously. The introduction of oxygen causes a pentavalent phosphorus source to form phosphorus pentoxide. Phosphorus pentoxide reacts with silicon to form phosphorus atoms. In addition, the addition of oxygen prevents the corrosion of phosphide on the surface of the semiconductor substrate. A $POCl_3$ liquid source diffusion method has the advantages of high production efficiency and can bring a good diffusion layer surface.

In some embodiments, $O_2$ is introduced at a flow rate ranging from 10 L/min to 12 L/min. The flow rate may be, for example, 10 L/min, 11 L/min or 12 L/min. If $O_2$ is introduced at a flow rate higher than 12 L/min, the growing oxide layer is excessively thick, and the migration of electrons may be blocked. If $O_2$ is introduced at a flow rate lower than 10 L/min, the growing oxide layer is excessively thin, and the quality of the film may not be effectively ensured.

In some embodiments, the gas introduction time ranges from 3 min to 5 min. The gas introduction time may be, for example, 3 min, 4 min or 5 min.

The temperature of the primary phosphorus diffusion ranges from 780° C. to 820° C. The temperature of the primary phosphorus diffusion may be, for example, 780° C., 790° C., 800° C., 810° C. or 820° C. The time of the primary phosphorus diffusion ranges from 50 s to 60 s. The time of the primary phosphorus diffusion may be, for example, 50 s, 51 s, 52 s, 53 s, 54 s, 55 s, 56 s, 57 s, 58 s, 59 s or 60 s. If the temperature of the primary phosphorus diffusion is lower than 780° C., the time is prolonged, the yield may decrease, and diffusion uniformity and repeatability may become worse. If the temperature of the primary phosphorus diffusion is higher than 820° C., the time is shortened, and diffusion uniformity and repeatability may not be ensured.

In some embodiments, the third oxide sub-layer 503 has a thickness ranging from 2 Å to 3 Å. The thickness of the third oxide sub-layer 503 may be, for example, 2 Å, 2.1 Å, 2.2 Å, 2.3 Å, 2.4 Å, 2.5 Å, 2.6 Å, 2.7 Å, 2.8 Å, 2.9 Å or 3 Å.

In step S22, the oxidization is continued to form a second oxide sub-layer 502 after the third oxide sub-layer 503 in step S21 is obtained. The second oxide sub-layer 502 is provided between the third oxide sub-layer 503 and the N-type semiconductor substrate 10.

A specific step involves: after $O_2$ is introduced at a flow rate ranging from 8 L/min to 10 L/min for 3 min to 5 min, stopping the gas introduction and performing oxidization, the temperature of the oxidization ranging from 500° C. to 530° C., and the time of the oxidization ranging from 350 s to 450 s.

In some embodiments, $O_2$ is introduced at a flow rate ranging from 8 L/min to 10 L/min. The flow rate may be, for example, 8 L/min, 9 L/min or 10 L/min. If $O_2$ is introduced at a flow rate higher than 10 L/min, the growing oxide layer is excessively thick, and the migration of electrons may be blocked. If $O_2$ is introduced at a flow rate lower than 8 L/min, the growing oxide layer is excessively thin, and the quality of the film may not be effectively ensured.

In some embodiments, the introduction time ranges from 3 min to 5 min. The introduction time may be, for example, 3 min, 4 min or 5 min.

A temperature of the oxidization ranges from 500° C. to 530° C. The temperature of the oxidization may be, for example, 500° C., 510° C., 520° C. or 530° C. A time of the oxidization ranges from 350 s to 450 s. The time of the oxidization may be, for example, 350 s, 360 s, 370 s, 380 s, 390 s, 400 s, 410 s, 420 s, 430 s, 440 s or 450 s. The time of the oxidization and the temperature of the oxidization are controlled within the above ranges, so that the silicon oxide layer having a thickness ranging from 8 Å to 10 Å can be obtained, which is conducive to improving the tunneling capability of the carriers.

In step S23, the oxidization is continued after the second oxide sub-layer 502 in step S22 is obtained, and during the oxidization, nitrogen diffusion is performed on the oxidized product to form a first oxide sub-layer 501. The first oxide sub-layer 501 is provided between the second oxide sub-layer 502 and the N-type semiconductor substrate 10.

A specific step may include: using a mixture of $O_2$ and $N_2O$ with a volume ratio of (2-4):1 as a doping source, the mixture being introduced at a flow rate ranging from 8 L/min to 10 L/min for 3 min to 5 min, and performing nitrogen diffusion on the oxidized product after the gas introduction stops, the temperature of the nitrogen diffusion ranging from 500° C. to 530° C., and the time of the nitrogen diffusion ranging from 40 s to 60 s.

In some embodiments, the volume ratio of $O_2$ to $N_2O$ is (2-4):1. The volume ratio may be, for example, 2:1, 3:1 or 4:1. Oxidization and nitrogen doping are performed simultaneously by using a mixture of $O_2$ and $N_2O$ as the doping source.

The mixture is introduced at a flow rate ranging from 8 L/min to 10 L/min. The flow rate may be, for example, 8 L/min, 9 L/min or 10 L/min. The flow rate of the mixture is controlled within the above range, which controls the doping proportion of nitrogen and improves the passivation effect.

In some embodiments, the introduction time ranges from 3 min to 5 min. The introduction time may be, for example, 3 min, 4 min or 5 min.

A temperature of the oxidization ranges from 500° C. to 530° C. The temperature of the oxidization may be, for example, 500° C., 510° C., 520° C. or 530° C. A time of the oxidization ranges from 350 s to 450 s. The time of the oxidization may be, for example, 350 s, 360 s, 370 s, 380 s, 390 s, 400 s, 410 s, 420 s, 430 s, 440 s or 450 s. The time of the oxidization and the temperature of the oxidization are controlled within the above ranges, which is conducive to the diffusion of doped elements, thereby increasing the interfacial dielectric constant of the oxide layer and improving the passivation effect.

In step S20, the structure of the oxide layer containing nitrogen and phosphorus of the first oxide sub-layer 501/the second oxide sub-layer 502/the third oxide sub-layer 503 manufactured in the present disclosure is very thin, only a monocrystalline silicon surface is required to be oxidized, and no silicon is additionally deposited. The whole reaction process is top-down. That is, firstly, the third oxide sub-layer doped with element P is produced by reaction, then the second oxide sub-layer undoped is produced by reaction, and finally the first oxide sub-layer doped with element N is produced by reaction.

In step S30, a polysilicon layer is deposited on a surface of the oxide layer 50 containing nitrogen and phosphorus, and secondary phosphorus diffusion is performed on the polysilicon layer to form a phosphorus-doped polysilicon layer 60.

In the above step, the polysilicon layer 60 is deposited on the surface of the oxide layer 50 containing nitrogen and phosphorus, to protect the oxide layer. Moreover, polysilicon is doped to form high-low junctions (n/n⁺-Si), which can effectively reduce the recombination rate of carriers on the back of the solar cell, and further improve the conversion efficiency of the solar cell.

In some embodiments, the polysilicon layer may be deposited on the surface of the third oxide sub-layer 503 by any one of low-pressure chemical vapor deposition (LPCVD), plasma enhanced chemical vapor deposition (PECVD), and atmospheric pressure chemical vapor deposition (APCVD).

In some embodiments, two-step heat treatment may be adopted for the secondary phosphorus diffusion. That is, the phosphorus source is decomposed at about 1000° C. and deposited on the surface of the N-type semiconductor substrate 10. Then, heat treatment is performed in a range from 800° C. to 900° C. to enable phosphorus atoms on the surface to diffuse into the polysilicon layer, forming the phosphorus-doped polysilicon layer 60. It is appreciated that, one-step deposition may also be adopted. That is, the polycrystalline silicon layer is deposited on the surface of the third oxide sub-layer 503 and in-situ doping is performed simultaneously to form the phosphorus-doped polysilicon layer 60. Any one or more of high-temperature diffusion, slurry doping, and ion implantation may also be adopted in a phosphorus diffusion process, which is not limited herein.

In some embodiments, a doping concentration of the phosphorus-doped polysilicon layer ranges from $1\times10^{19}$ cm$^{-3}$ to $1\times10^{21}$ cm$^{-3}$. The doping concentration may be, for example, $1\times10^{19}$ cm$^3$, $1\times10^{20}$ cm$^{-3}$ or $1\times10^{21}$ cm$^{-3}$. The doping concentration is controlled within the above range, which is conducive to improving passivation performance.

In some embodiments, a PSG layer formed on the back of the solar cell during phosphorus diffusion and a BSG layer formed during boron diffusion on the front of the solar cell are removed.

In step S40, a second passivation layer 70 is formed on a surface of the phosphorus-doped polysilicon layer.

In some embodiments, the second passivation layer 70 is formed on the surface of the phosphorus-doped polysilicon layer. The second passivation layer 70 may include, but is not limited to, silicon nitride, silicon oxynitride, aluminum oxide and other monolayers, or oxide layer structures containing nitrogen and phosphorus.

For example, the second passivation layer 70 is made of silicon nitride. A silicon nitride film may act as an antireflection film, and the silicon nitride film has good insulation, compactness and stability, and is capable of masking impurity ions. The silicon nitride film can perform passivation to the semiconductor substrate, which significantly improves photoelectric conversion efficiency of the solar cell.

In step S50, a first passivation layer 30 is formed on a surface of the boron diffusion layer 20, a first electrode 40 is formed on the first passivation layer 30, and a second electrode 80 is formed on the second passivation layer 70.

In some embodiments, the first passivation layer 30 may include, but is not limited to, silicon nitride, silicon oxynitride, aluminum oxide and other monolayers or oxide layer structures containing nitrogen and phosphorus. The first passivation layer 30 may also be a passivation layer of other types. The specific material of the first passivation layer 30 is not limited in the present disclosure. For example, in other embodiments, the first passivation layer 30 may also be, for example, silicon dioxide and silicon nitride or an oxide layer containing nitrogen and phosphorus. The first passivation layer 30 can have good passivation effect on the semiconductor substrate, which is helpful to improve the conversion efficiency of the solar cell. In some embodiments, on the front surface of the semiconductor substrate, a front busbar and front fingers are printed with aluminum-doped silver paste and dried to form the first electrode 40. In some embodiments, on the rear surface of the semiconductor substrate, a rear-surface busbar and rear-surface fingers may be printed with silver paste and dried to form the second electrode 80. Finally, dried solar cells are sintered to form the solar cell.

It is to be noted that the first electrode 40 passes through the first passivation layer 30 to form ohmic contact with the boron diffusion layer 20. The second electrode 80 passes through the second passivation layer 70 to form ohmic contact with the phosphorus-doped polysilicon layer 60. The phosphorus-doped polysilicon layer 60 and an oxide layer containing elements N and P (the first oxide sub-layer 501, the second oxide sub-layer 502, and the third oxide sub-layer 503) form a Topcon cell structure.

Specific materials of the first electrode 40 and the second electrode 80 are not limited in the embodiments of the present disclosure. For example, the first electrode 40 is a silver electrode or a silver/aluminum electrode, and the second electrode 80 is a silver electrode.

Specific types of the first passivation layer 30 and the second passivation layer 70 are not limited in the embodiments of the present disclosure, which may be, for example, a silicon nitride layer, a silicon oxynitride layer, aluminum oxide/silicon nitride or an oxide layer structure containing nitrogen and phosphorus.

In a third aspect, according to some embodiments of the present disclosure, a photovoltaic module is further provided. The photovoltaic module includes a first substrate, a first packaging layer, a solar cell string structure, a second packaging layer, and a second substrate sequentially stacked formed in a stacked structure, and the stacked structure is laminated. The photovoltaic module is obtained through an electrical connection between a conductor and the solar cell during the lamination.

In some embodiments, the photovoltaic module includes a plurality of solar cell strings. Each solar cell string includes a plurality of solar cells connected through a conductive strip. The solar cell may be the solar cell described above or the solar cell manufactured by the above manufacturing method.

In some embodiments, the plurality of solar cells are located in a same plane and electrically connected in the form of a clearance (small clearance) or zero clearance.

Embodiments of the present disclosure are further described below with multiple embodiments. The embodiments of the present disclosure are not limited to the following specific embodiments. Appropriate modifications can be implemented within the scope of the independent claims.

Embodiment 1

In step S10, boron diffusion is performed on a front surface of an N-type semiconductor substrate 10 after texturing, to form a boron diffusion layer 20.

In step S20, an oxide layer is deposited on a monocrystalline silicon surface by plasma enhanced chemical vapor deposition.

In step S21, a $POCl_3$ source is switched on, $POCl_3$ is liquid and is required to be brought out via $O_2$. $O_2$ is at a flow rate of 12 L/min. After 5 minutes of gas introduction, the gas introduction is stopped, and the temperature is kept at 800° C. to react for 60 s to form a phosphorus-doped oxide layer.

In step S22, the $POCl_3$ source is switched off. The flow rate of $O_2$ is kept at 10 L/min. After 5 minutes of gas introduction, the gas introduction is stopped, and the temperature is kept at 500° C. to react for 450 s to form a silicon oxide layer.

In step S23, a mixture of $O_2$ and $N_2O$ is used as a doping source. A volume ratio of the mixture is $O_2:N_2O=3:1$. A flow rate of the mixture is 10 L/min. After 5 minutes of gas introduction, the gas introduction is stopped, and the temperature is kept at 500° C. to react for 60 s to form a nitrogen-doped oxide layer.

In step S30, a polysilicon layer is deposited on a surface of the phosphorus-doped oxide layer by plasma enhanced chemical vapor deposition, and secondary phosphorus diffusion is performed on the polysilicon layer to form a phosphorus-doped polysilicon layer.

In step S40, a second passivation layer is formed on a surface of the phosphorus-doped polysilicon layer, and a second electrode is formed on the second passivation layer.

Embodiment 2

In step S10, boron diffusion is performed on a front surface of an N-type semiconductor substrate 10 after texturing, to form a boron diffusion layer 20.

In step S20, an oxide layer is deposited on a monocrystalline silicon surface by plasma enhanced chemical vapor deposition.

In step S21, a $POCl_3$ source is switched on, $POCl_3$ is liquid and is required to be brought out via $O_2$. $O_2$ is at a flow rate of 10 L/min. After 5 minutes of gas introduction, the gas introduction is stopped, and the temperature is kept at 780° C. to react for 55 s to form a phosphorus-doped oxide layer.

In step S22, the $POCl_3$ source is switched off. The flow rate of $O_2$ is kept at 9 L/min. After 5 minutes of gas introduction, the gas introduction is stopped, and the temperature is kept at 510° C. to react for 450 s to form a silicon oxide layer.

In step S23, a mixture of $O_2$ and $N_2O$ is used as a doping source. A volume ratio of the mixture is $O_2:N_2O=4:1$. A flow rate of the mixture is 10 L/min. After 5 minutes of gas introduction, the gas introduction is stopped, and the temperature is kept at 530° C. to react for 60 s to form a nitrogen-doped oxide layer.

In step S30, a polysilicon layer is deposited on a surface of the phosphorus-doped oxide layer by plasma enhanced chemical vapor deposition, and secondary phosphorus diffusion is performed on the polysilicon layer to form a phosphorus-doped polysilicon layer.

In step S40, a second passivation layer is formed on a surface of the phosphorus-doped polysilicon layer, and a second electrode is formed on the second passivation layer.

Embodiment 3

In step S10, boron diffusion is performed on a front surface of an N-type semiconductor substrate 10 after texturing, to form a boron diffusion layer 20.

In step S20, an oxide layer is deposited on a monocrystalline silicon surface by plasma enhanced chemical vapor deposition.

In step S21, a $POCl_3$ source is switched on, $POCl_3$ is liquid and is required to be brought out via $O_2$. $O_2$ is at a flow rate of 10 L/min. After 5 minutes of gas introduction, the gas introduction is stopped, and the temperature is kept at 820° C. to react for 60 s to form a phosphorus-doped oxide layer.

In step S22, the $POCl_3$ source is switched off. The flow rate of $O_2$ is kept at 8 L/min. After 5 minutes of gas introduction, the gas introduction is stopped, and the temperature is kept at 530° C. to react for 450 s to form a silicon oxide layer.

In step S23, a mixture of $O_2$ and $N_2O$ is used as a doping source. A volume ratio of the mixture is $O_2:N_2O=2:1$. A flow rate of the mixture is 9 L/min. After 5 minutes of gas introduction, the gas introduction is stopped, and the temperature is kept at 510° C. to react for 60 s to form a nitrogen-doped oxide layer.

In step S30, a polysilicon layer is deposited on a surface of the phosphorus-doped oxide layer by plasma enhanced chemical vapor deposition, and secondary phosphorus diffusion is performed on the polysilicon layer to form a phosphorus-doped polysilicon layer.

In step S40, a second passivation layer is formed on a surface of the phosphorus-doped polysilicon layer, and a second electrode is formed on the second passivation layer.

Comparative Example 1

Different from Embodiment 1, steps S20 to S23 can be substituted by: generating a SiO$_2$ layer having a thickness of about 10 Å on a rear surface of a semiconductor substrate by LPCVD. Specific parameters are as follows. O$_2$ is introduced at a flow rate of 15 L/min, after 5 minutes of gas introduction, the gas introduction is stopped, and the temperature is kept at 500° C. to react for 550 s to form a silicon oxide layer.

Performance tests of Embodiments 1 to 3 and Comparative Example 1 are shown in Table 1 below.

TABLE 1

Comparison of performance parameters between Embodiments 1-3 and Comparative Example 1

| Group | Thickness of oxide layer (Å) | Open-circuit voltage (V) | Filling factor (%) | Conversion efficiency (%) |
|---|---|---|---|---|
| Embodiment 1 | 16 | 0.715 | 83.44 | 24.74 |
| Embodiment 2 | 15 | 0.714 | 83.42 | 24.72 |
| Embodiment 3 | 16 | 0.716 | 83.45 | 24.75 |
| Comparative Example 1 | 10 | 0.708 | 83.1 | 24.44 |

As can be seen from Table 1, in Embodiments 1 to 3 of the present disclosure, an oxide layer structure containing nitrogen and phosphorus including a silicon oxynitride layer 501, a silicon dioxide layer 502, and a phosphorus-containing silicon oxide layer 503 is provided between the rear surface of the N-type semiconductor substrate 10 and the phosphorus-doped polysilicon layer 60. With the doping of element N and the doping of element P, the open-circuit voltage and the filling factor of the solar cell are significantly increased, thereby improving the conversion efficiency of the solar cell. The conversion efficiency of the solar cell manufactured according to some embodiments of the present disclosure is maximally increased by 0.31% compared with Comparative Example 1. Thus, the solar cell manufactured according to the present disclosure is of great significance to the utilization of solar energy and the development of solar cells.

The present disclosure is described above with preferred embodiments, but these embodiments are not intended to limit the claims. Any person skilled in the art can make possible variations and modifications without departing from the conception of the present disclosure. Therefore, the protection scope of the present disclosure should be subject to the scope defined by the claims of the present disclosure.

What is claimed is:

1. A solar cell, comprising:
an N-type semiconductor substrate having a front surface and a rear surface opposite to the front surface;
a boron diffusion layer arranged on the front surface of the N-type semiconductor substrate, wherein a first passivation layer is provided on a surface of the boron diffusion layer, and a first electrode is provided passing through the first passivation layer to form an electrical connection with the N-type semiconductor substrate; and
a phosphorus-doped polysilicon layer arranged on the rear surface of the N-type semiconductor substrate, wherein a silicon oxide layer containing nitrogen and phosphorus is provided between the rear surface of the N-type semiconductor substrate and the phosphorus-doped polysilicon layer, a second passivation layer is provided on a surface of the phosphorus-doped polysilicon layer, and a second electrode is provided passing through the second passivation layer to form an electrical connection with the phosphorus-doped polysilicon layer,
wherein the silicon oxide layer comprises a first oxide sub-layer, a second oxide sub-layer, and a third oxide sub-layer, wherein the first oxide sub-layer is a nitrogen-doped silicon oxide layer, the second oxide sub-layer is made of silicon dioxide, and the third oxide sub-layer is a phosphorus-doped silicon oxide layer.

2. The solar cell according to claim 1, wherein at least one of the first oxide sub-layer, the second oxide sub-layer, and the third oxide sub-layer contains Al and/or Ta.

3. The solar cell according to claim 1, wherein the nitrogen-doped silicon oxide layer includes SiO$_x$N$_y$, where y/(x+y)<15%, and/or a doping concentration of nitrogen in the nitrogen-doped silicon oxide layer decreases from the N-type semiconductor substrate to the phosphorus-doped polysilicon layer.

4. The solar cell according to claim 1, wherein the first oxide sub-layer has a thickness in a range from 1 Å to 2 Å.

5. The solar cell according to claim 1, wherein a doping concentration of phosphorus in the phosphorus-doped silicon oxide layer is in a range from $1\times10^{10}$ cm$^{-3}$ to $1\times10^{18}$ cm$^{-3}$, and/or a doping concentration of phosphorus in the phosphorus-doped silicon oxide layer increases from the N-type semiconductor substrate to the phosphorus-doped polysilicon layer.

6. The solar cell according to claim 1, wherein the third oxide sub-layer has a thickness in a range from 2 Å to 3 Å.

7. The solar cell according to claim 1, wherein the second oxide sub-layer has a thickness in a range from 8 Å to 10 Å, and/or the second oxide sub-layer has a pinhole density in a range from $10^{-6}$ to $10^{-3}$.

8. The solar cell according to claim 1, wherein a sum of thicknesses of the first oxide sub-layer, the second oxide sub-layer, and the third oxide sub-layer is less than or equal to 16 Å.

9. The solar cell according to claim 1, wherein the phosphorus-doped polysilicon layer has a doping concentration in a range from $1\times10^{19}$ cm$^{-3}$ to $1\times10^{21}$ cm$^{-3}$.

10. The solar cell according to claim 1, wherein the first passivation layer includes at least one of silicon nitride, silicon oxynitride, and aluminum oxide, and/or the second passivation layer comprises at least one of silicon nitride, silicon oxynitride, and aluminum oxide.

11. The solar cell according to claim 1, wherein the first electrode is a silver electrode or a silver/aluminum electrode, and/or the second electrode is a silver electrode.

12. A method for manufacturing a solar cell, comprising:
performing boron diffusion on a front surface of an N-type semiconductor substrate after the N-type semiconductor substrate is textured, to form a boron diffusion layer;
forming an oxide layer containing nitrogen and phosphorus on a rear surface of the N-type semiconductor substrate;
depositing a polysilicon layer on a surface of the oxide layer containing nitrogen and phosphorus, and performing secondary phosphorus diffusion on the polysilicon layer, to form a phosphorus-doped polysilicon layer;
forming a second passivation layer on a surface of the phosphorus-doped polysilicon layer;

forming a first passivation layer on a surface of the boron diffusion layer, and forming a first electrode by passing through the first passivation layer to be electrically connected to the boron diffusion layer; and forming a second electrode by passing through the second passivation layer to be electrically connected to the phosphorus-doped polysilicon layer, wherein the oxide layer comprises a first oxide sub-layer, a second oxide sub-layer, and a third oxide sub-layer, wherein the first oxide sub-layer is a nitrogen-doped silicon oxide layer, the second oxide sub-layer is made of silicon dioxide, and the third oxide sub-layer is a phosphorus-doped silicon oxide layer.

13. The method according to claim 12, wherein forming an oxide layer containing nitrogen and phosphorus comprises:

during oxidization, performing primary phosphorus diffusion on an oxidized product to form the third oxide sub-layer; continuing the oxidization to form the second oxide sub-layer after the third oxide sub-layer is formed, wherein the second oxide sub-layer is provided between the third oxide sub-layer and the N-type semiconductor substrate; continuing the oxidization after the second oxide sub-layer is formed, and during the oxidization, performing nitrogen diffusion on the oxidized product to form the first oxide sub-layer, wherein the first oxide sub-layer is provided between the second oxide sub-layer and the N-type semiconductor substrate.

14. The method according to claim 12, wherein continuing oxidization to form the second oxide sub-layer after the third oxide sub-layer comprises:

after $O_2$ is introduced at a flow rate in a range from 8 L/min to 10 L/min for 3 min to 5 min, stopping the introduction and performing oxidization, wherein a temperature of the oxidization is in a range from 500° C. to 530° C., and a time of the oxidization is in a range from 350 s to 450 s.

15. The method according to claim 12, wherein continuing oxidization after the second oxide sub-layer is formed, and during the oxidization, performing nitrogen diffusion on an oxidized product to form the first oxide sub-layer comprises:

using a mixture of $O_2$ and $N_2O$ with a volume ratio of (2-4):1 as a doping source, introducing the mixture at a flow rate in a range from 8 L/min to 10 L/min for 3 min to 5 min, and performing nitrogen diffusion on the oxidized product after the introduction stops, wherein a temperature of the nitrogen diffusion is in a range from 500° C. to 530° C., and a time of the nitrogen diffusion is in a range from 40 s to 60 s.

16. The method according to claim 12, wherein performing primary phosphorus diffusion on an oxidized product to form the third oxide sub-layer comprises:

using a phosphorus source as a doping source, introducing $O_2$ at a flow rate in a range from 10 L/min to 12 L/min for 3 min to 5 min, and performing primary phosphorus diffusion on the oxidized product after the introduction stops, wherein a temperature of the primary phosphorus diffusion is in a range from 780° C. to 820° C., and a time of the primary phosphorus diffusion is in a range from 50 s to 60 s.

17. A photovoltaic module, comprising a plurality of solar cell strings, wherein each of the plurality of solar cell strings comprises a plurality of solar cells, and at least one of the plurality of solar cells comprises:

an N-type semiconductor substrate having a front surface and a rear surface opposite to the front surface;

a boron diffusion layer arranged on the front surface of the N-type semiconductor substrate, wherein:

a first passivation layer is provided on a surface of the boron diffusion layer, and a first electrode is provided passing through the first passivation layer to form an electrical connection with the N-type semiconductor substrate; and a phosphorus-doped polysilicon layer arranged on the rear surface of the N-type semiconductor substrate, wherein a silicon oxide layer containing nitrogen and phosphorus is provided between the rear surface of the N-type semiconductor substrate and the phosphorus-doped polysilicon layer, a second passivation layer is provided on a surface of the phosphorus-doped polysilicon layer, and a second electrode is provided passing through the second passivation layer to form an electrical connection with the phosphorus-doped polysilicon layer, wherein the silicon oxide layer comprises a first oxide sub-layer, a second oxide sub-layer, and a third oxide sub-layer, wherein the first oxide sub-layer is a nitrogen-doped silicon oxide layer, the second oxide sub-layer is made of silicon dioxide, and the third oxide sub-layer is a phosphorus-doped silicon oxide layer.

18. The solar cell according to claim 1, wherein the first oxide sub-layer is arranged between the rear surface of the N-type semiconductor substrate and the second oxide sub-layer, the second oxide sub-layer is arranged between the first oxide sub-layer and the third oxide sub-layer, and the third oxide sub-layer is arranged between the second oxide sub-layer and the phosphorus-doped polysilicon layer.

19. The solar cell according to claim 1, wherein the first oxide sub-layer does not contain phosphorus, the second oxide sub-layer does not contain phosphorus or nitrogen, and the third oxide sub-layer does not contain nitrogen.

20. The solar cell according to claim 1, wherein the second electrode extends beyond the surface of the phosphorus-doped polysilicon layer and is recessed into the phosphorus-doped polysilicon layer.

\* \* \* \* \*